United States Patent
Gaidis et al.

(10) Patent No.: US 7,211,446 B2
(45) Date of Patent: May 1, 2007

(54) METHOD OF PATTERNING A MAGNETIC TUNNEL JUNCTION STACK FOR A MAGNETO-RESISTIVE RANDOM ACCESS MEMORY

(75) Inventors: Michael C. Gaidis, Wappingers Falls, NY (US); David W. Abraham, Croton, NY (US); Stephen L. Brown, Carmel, NY (US); Arunava Gupta, Tuscaloosa, AL (US); Chanro Park, Samois sur Seine (FR); Wolfgang Raberg, Fountainebleau (FR)

(73) Assignees: International Business Machines Corporation, Armonk, NY (US); Infineon Technologies AG, Munich (DE)

( * ) Notice: Subject to any disclaimer, the term of this patent is extended or adjusted under 35 U.S.C. 154(b) by 100 days.

(21) Appl. No.: 10/709,999

(22) Filed: Jun. 11, 2004

(65) Prior Publication Data

US 2005/0277206 A1 Dec. 15, 2005

(51) Int. Cl.
*H01L 21/00* (2006.01)

(52) U.S. Cl. .................. 438/3; 438/257; 438/593; 438/E43.006; 257/295

(58) Field of Classification Search .............. 438/3, 438/257
See application file for complete search history.

(56) References Cited

U.S. PATENT DOCUMENTS

| | | | |
|---|---|---|---|
| 4,619,872 A | 10/1986 | Goor et al. | |
| 5,792,569 A | 8/1998 | Sun et al. | |
| 5,946,228 A | 8/1999 | Abraham et al. | |
| 6,034,887 A | 3/2000 | Gupta et al. | |
| 6,072,718 A | 6/2000 | Abraham et al. | |
| 6,104,633 A | 8/2000 | Abraham et al. | |
| 6,299,991 B1 | 10/2001 | Bojarczuk, Jr. et al. | |
| 6,333,067 B2 | 12/2001 | Bojarczuk, Jr. et al. | |
| 6,365,419 B1 | 4/2002 | Durlam et al. | |
| 6,385,082 B1 | 5/2002 | Abraham et al. | |
| 6,452,764 B1 | 9/2002 | Abraham et al. | |
| 6,495,275 B2 | 12/2002 | Kamiguchi et al. | |
| 6,538,919 B1 | 3/2003 | Abraham et al. | |
| 6,548,849 B1 | 4/2003 | Pan et al. | |
| 6,660,568 B1 | 12/2003 | Gaidis | |
| 6,784,091 B1 | 8/2004 | Nuetzel et al. | |
| 6,812,141 B1 | 11/2004 | Gaidis et al. | |
| 2002/0009616 A1 | 1/2002 | Kamiguchi et al. | |
| 2002/0048127 A1 | 4/2002 | Fukuzawa et al. | |

(Continued)

OTHER PUBLICATIONS

Abraham et al., "A 0.18um Logic-Based MRAM Technology for High Performance Nonvolatile Memory Applications," VLSI Conference, IEEE Journal of Solid State Circuits Society, 2003.

(Continued)

*Primary Examiner*—Dung A. Le
(74) *Attorney, Agent, or Firm*—Daryl K. Neff; Margaret A. Pepper

(57) ABSTRACT

A method of patterning a magnetic tunnel junction (MTJ) stack is provided. According to such method, an MTJ stack is formed having a free layer, a pinned layer and a tunnel barrier layer disposed between the free layer and the pinned layer. A first area of the MTJ stack is masked while the free layer of the MTJ is exposed in a second area. The free layer is then rendered electrically and magnetically inactive in the second area.

18 Claims, 3 Drawing Sheets

U.S. PATENT DOCUMENTS

| | | |
|---|---|---|
| 2003/0181056 A1 | 9/2003 | Kumar et al. |
| 2003/0198113 A1 | 10/2003 | Abraham et al. |
| 2004/0001350 A1 | 1/2004 | Abraham et al. |
| 2004/0043526 A1* | 3/2004 | Ying et al. .................... 438/38 |
| 2004/0051522 A1 | 3/2004 | Worledge et al. |
| 2004/0084400 A1* | 5/2004 | Costrini et al. ............... 216/22 |
| 2004/0252559 A1 | 12/2004 | Gupta |
| 2004/0253437 A1 | 12/2004 | Ingvarsson et al. |
| 2004/0259274 A1* | 12/2004 | Park et al. .................... 438/3 |
| 2005/0020076 A1* | 1/2005 | Lee et al. ................... 438/689 |
| 2005/0050399 A1 | 3/2005 | Abraham et al. |
| 2005/0079647 A1 | 4/2005 | Abraham et al. |
| 2005/0079683 A1 | 4/2005 | Sarma et al. |
| 2005/0087519 A1 | 4/2005 | Klostermann et al. |
| 2005/0088875 A1 | 4/2005 | Abraham et al. |
| 2005/0102581 A1 | 5/2005 | Abraham et al. |
| 2005/0127418 A1 | 6/2005 | Abraham |
| 2005/0151552 A1 | 7/2005 | Abraham et al. |
| 2005/0185458 A1 | 8/2005 | Abraham |

OTHER PUBLICATIONS

Chen et al. "Magnetic Tunnel Junction Pattern Technique", Journal of Applied Physics, vol. 93, No. 10, 2003.

DeBrosse et al. "A High-Speed 128Kbit MRAM Core For Future Universal Memory Applications," VLSI Conference, IEEE Journal of Solid State Circuits Society, 2003.

* cited by examiner

METHOD OF PATTERNING A MAGNETIC TUNNEL JUNCTION STACK FOR A MAGNETO-RESISTIVE RANDOM ACCESS MEMORY

BACKGROUND OF INVENTION

The invention relates to microelectronic devices, and more particularly to a magnetic tunnel junction and method for patterning the same.

In a magneto-resistive random access memory (MRAM), information is stored in arrays of magnetic storage elements known as magnetic tunnel junctions (MTJs). One of the advantages of MRAM is the capability of the MTJ storage array to be placed in a level above the surface of a semiconductor substrate. In that way, the surface area of the semiconductor substrate is conserved for use by relatively few transistors used to control the MTJ array. In addition, the available substrate surface area does not constrain the density of the MRAM to the same extent as in other types of memory. MRAM technology potentially offers great benefits to the integration of processors and other system elements on a single integrated circuit (IC or "chip"), commonly referred to as "systems on a chip" (SOCs). The placement of the MTJ array in a layer above the semiconductor substrate surface increases the flexibility for fabricating the MRAM cell control transistors in the substrate. With such flexibility, MRAM cell control transistors can be fabricated using most, if not all of the same process steps as transistors used in logic circuitry, e.g. a microprocessor, of such chip.

Another advantage of MRAM compared to dynamic random access memory (DRAM) and static random access memory (SRAM), is that the stored information is non-volatile. In an MRAM, information is stored according to the orientation of magnetic dipoles within an MTJ storage element of each MRAM cell. The magnetic dipoles are re-orientable by application of a magnetic field to program the MTJ, that is, to write information to the MTJ. Once the MTJ is programmed by the magnetic field, the MTJ remains in either a first state or a second state until reprogrammed by a different magnetic field, even if power is removed from the MTJ in the meantime. An advantage of MRAM compared to other non-volatile rewriteable memory such as flash memory, is that the MTJ has longer life. Current technology suggests that MTJs are reprogrammable many billions of cycles. Flash memory, which utilizes thin dielectrics and is reprogrammed by applying relatively high voltage (10 V to 15 V) and current, typically fails within one million cycles.

A magnetic tunnel junction memory element includes a structure having ferromagnetic layers separated by a non-magnetic tunnel barrier. Digital information is stored and represented in the memory element as directions of magnetization vectors in the ferromagnetic layers. More specifically, the magnetic moment of one magnetic layer is fixed. Such layer is called the "pinned" or "reference" layer. The magnetic moment of the other magnetic layer may be switched to be either parallel or antiparallel to the pinned layer. This layer is called the "free" or "soft" layer. When the orientations in the pinned layer and the free layer are parallel, the MTJ is in a first state having a first electrical resistance. On the other hand, when the orientations in the pinned layer and the free layer are antiparallel, the MTJ is in a second state, in which its electrical resistance is significantly higher than in the first state. In general, the device state is determined by the orientation of the magnetic films in closest proximity to the tunnel barrier, even if the pinned and free layers are themselves comprised of multiple layers of materials. Such composite pinned and free layers are common, as they can enhance device operation and lifetime.

The patterning of the MTJ device is one of the most challenging aspects of fabrication. Conventional techniques used to pattern other structures of a chip, such as reactive ion etching (RIE) or ion milling, have been less than satisfactory when applied to the materials that compose magnetic stacks. In most cases utilizing such techniques, it is extremely difficult to cleanly remove etched material. Physical sputtering, often the dominant component of magnetic material RIE, usually results in the formation of re-deposited residues (called "fences" or "veils") that can short circuit the junctions of the MTJ, as well as short circuit conductive patterns in different metal layers. Short circuiting may occur either immediately as a result of such fence residues, or after subsequent high temperature processing.

Another problem of conventional etch techniques is corrosion and degradation of the patterned free and pinned layers that form the MTJ, due to chemical residue remaining after etching. Exposure to reactive gases during deposition of dielectrics such as silicon nitride and silicon dioxide after the etching of the MTJ can also cause corrosion and degradation. For example, fluorine and/or chlorine species may be present when plasma-etching a stack of magnetic films. Chlorine and fluorine species can combine with conductive and photoresist material removed in the process to deposit a conductive residue along sidewalls of the stack. When subjected to high temperatures, the residue can migrate and cause corrosion, degradation and electrical shorting.

One way proposed for handling these problems is development of a process having better selective etch control to minimize exposure of sensitive interfaces to corrosive chemicals and conductive fences. Such etch process should have high selectivity, in order for etching to stop when the thin tunnel barrier layer of a magnetic film stack is reached. Such etch process is known as stop on alumina (SOA), named historically because many of the MTJ tunnel barriers are formed from alumina-type compounds. However, the tight process control and high selectivity required to maintain an acceptably controlled etch process across an entire wafer is difficult to achieve. Moreover, the SOA process does not necessarily protect the free layer from harmful corrosion and degradation.

Accordingly, it is desirable to provide an improved structure and method for patterning magnetic tunnel junctions of an MRAM.

SUMMARY OF INVENTION

According to an aspect of the invention, a method of patterning a magnetic tunnel junction (MTJ) stack is provided. According to such method, an MTJ stack is formed having a free layer, a pinned layer and a tunnel barrier layer disposed between the free layer and the pinned layer. A first area of the MTJ stack is masked while the free layer of the MTJ is exposed in a second area. The free layer is then rendered electrically and magnetically inactive in the second area.

According to another aspect of the invention, a method is provided for patterning an MTJ stack of a magneto-resistive random access memory (MRAM). Such method includes forming an interlevel dielectric layer (ILD) over a substrate, the ILD including a plurality of conductive lines and vias. An MTJ stack is then formed overlying the ILD, the MTJ stack including a pinned layer, a tunnel barrier layer overlying the pinned layer, and a free layer overlying the tunnel barrier layer. A portion of the MTJ stack is masked to expose an area of the free layer. The exposed area is then converted to a non-magnetic compound by altering its composition.

According to yet another aspect of the invention, a structure including a magnetic tunnel junction (MTJ) is provided. Such structure includes an MTJ stack having a first portion of a pinned layer, a first portion of a tunnel barrier layer overlying the first portion of the pinned layer, and a free layer overlying the first portion of the tunnel barrier layer. The structure further includes a layered stack abutting one or more peripheral edges of the MTJ stack, the layered stack including a second portion of the pinned layer, a second portion of the tunnel barrier layer, and an electrically and magnetically inactive compound of a material included in the free layer.

DETAILED DESCRIPTION

Figure 1:
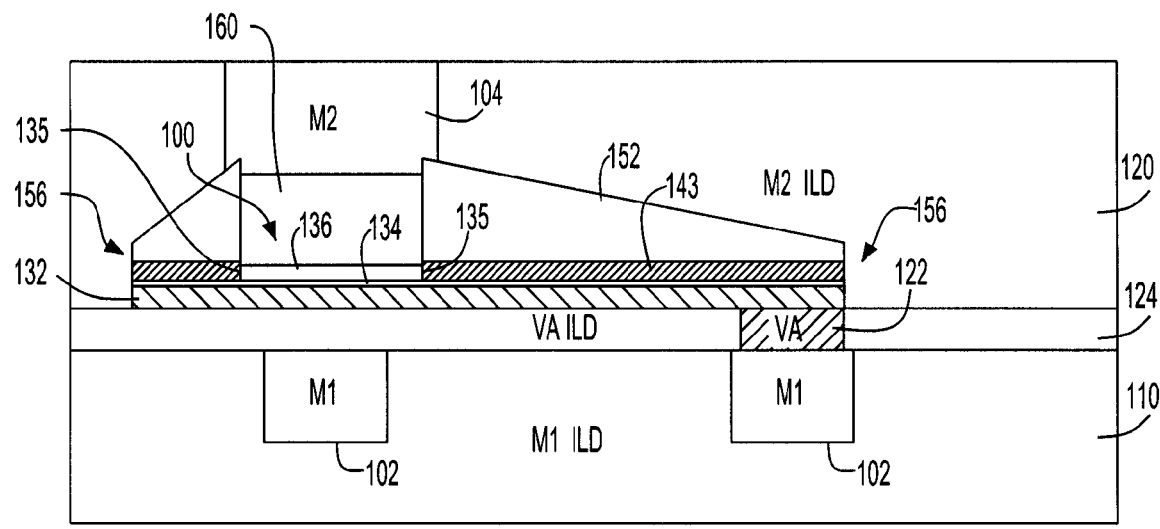
FIGS. 1 through 4 are cross sectional views illustrating stages in the fabrication of a magnetic tunnel junction (MTJ) according to an embodiment of the invention.

FIG. 1 is a cross-sectional view illustrating the structure of a patterned MTJ storage element 100 and its interconnection to M1 and M2 conductive lines. The MTJ 100 includes a pinned layer 132, a tunnel barrier layer 134 and a free layer 136. Each of these layers 132, 134, and 136 can include one or several layers which work together to enhance device performance or manufacturability. The free layer 136 is adjoined at first edges 135 of the MTJ by portions 143 of the free layer material that has been purposely inactivated. Preferably, the free layer 136 is also adjoined by the same type of inactivated material at second edges (not shown) in front of and in back of the MTJ 100, (the second edges not being visible in the particular cross-section shown), such that the MTJ 100 is surrounded by the same type of purposely inactivated material. The portions 143 of inactivated material extend to outer edges 156 of the patterned structure beyond the MTJ 100. The pinned layer 132 and tunnel barrier layer 134 also extend in a substantially horizontal direction to areas beyond the first edges 135 and second edges of the MTJ 100 to the outer edges 156.

The MTJ 100 is disposed at the crossing of M1 and M2 conductive lines 102, 104. The M1 conductive lines 102 are parts of a first metallization layer that includes a first interlevel dielectric layer (ILD) 110 for electrically isolating the M1 lines from each other. The M2 conductive line 104 is part of a second metallization layer, which includes a second interlevel dielectric layer (ILD) 120 that electrically isolates respective M2 lines from each other. A conductive via 122 is disposed in an interlevel dielectric layer VA ILD 124 lying between the first and second ILDs 110 and 120, the conductive via 122 interconnecting an M1 line 102 to the pinned layer 132 of the MTJ 100. Conductive interconnection between the MTJ 100 and the M2 conductive line 104 is provided by a conductive member 160 which may also serve as a hard mask during processing.

Figure 2:
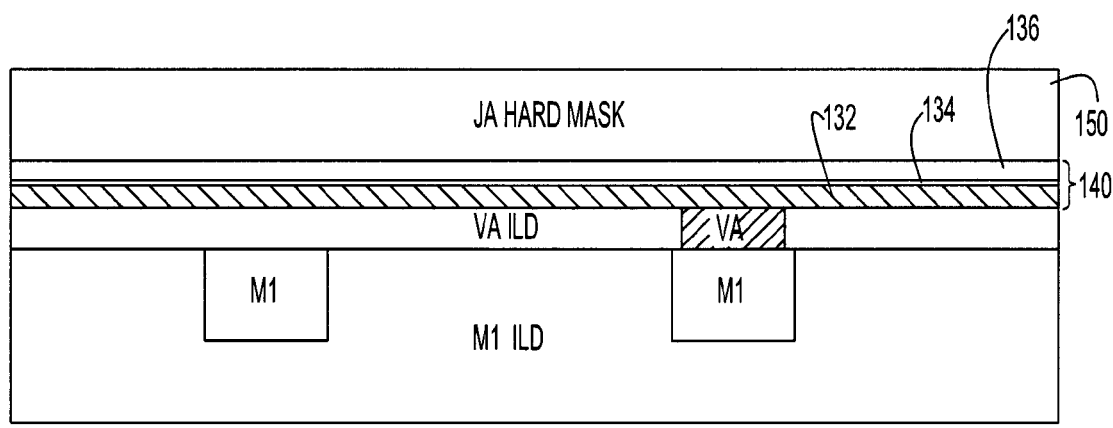

Referring to FIG. 2, a method of fabricating an MTJ according to a preferred embodiment of the invention will now be described. As shown in FIG. 2, a layered stack 140 is provided including the pinned layer 132, a tunnel barrier layer 134, and a free layer 136. The pinned layer 132 typically includes the following layers listed in order, from the bottom up: an adhesion layer, typically including 5 to 10 nm of TaN and/or Ta, a relatively thick antiferromagnet, illustratively including a 20 nm thick layer of PtMn or IrMn, and then a ferromagnetic "reference" layer or set of layers formed overlying and pinned by the antiferromagnet. The ferromagnetic reference layer is comprised of films such as CoFe and NiFe, which may be interspersed with a nonmagnetic coupling layer such as Ru or TaN that is used to reduce offsets from demagnetization fields. A representative thickness of the ferromagnetic reference layer(s) is 2 to 5 nm. The purpose of the antiferromagnet is to fix the ferromagnetic reference layer(s) such that they will not switch magnetization direction during normal operation, thus providing a reference against which to compare the free layer magnetization direction (which will be switched). The foregoing layers make up the pinned layer of the MTJ.

The tunnel barrier layer 134 is formed by deposition of a thin dielectric layer onto the pinned layer 132. Typically, the tunnel barrier layer 134 is formed of an oxide of aluminum, such as including or similar to $Al_2O_3$, having a thickness of about 1 nm. Other materials available for use as the tunnel barrier layer 134 include oxides of magnesium, oxides of silicon, nitrides of silicon, and carbides of silicon; oxides, nitrides and carbides of other elements, or combinations of elements and other materials including or formed from semiconducting materials.

The free layer 136 is formed by depositing onto the tunnel barrier layer 134 a layer of nickel-iron (NiFe) having a thickness of about 5 nm. Thereafter, a conductive barrier layer of tantalum nitride (TaN) having a thickness of about 5 nm is formed by deposition. This TaN layer serves to protect the NiFe layer during subsequent processing and to provide adhesion for one or more subsequently formed layers. Alternatively, NiCoFe, amorphous CoFeB, and similar ferromagnets can be used in place of NiFe as the ferromagnetic portion of the free layer. In an alternative embodiment, the free layer can be formed of more than one such ferromagnetic layer to enhance performance or manufacturability. Multiple layers may be separated by non-magnetic layers like TaN or Ru. These layers typically range in thickness from 2 to 10 nm.

As further shown in FIG. 2, a layer 150 of hard mask material is formed on the layered stack 140. In the simplest embodiment, the hard mask 150 is formed from a conductive material such as tantalum nitride (TaN) or titanium nitride (TiN). Alternatively, the hardmask is formed from a sacrificial material and can be a dielectric or a conductor. In such case, after patterning the MTJ, the sacrificial material is removed and replaced by a conductor to connect the M2 wire (FIG. 1) with the free layer of the MTJ. The connecting conductor and M2 metallization can be formed by standard copper Damascene techniques.

Figure 3:
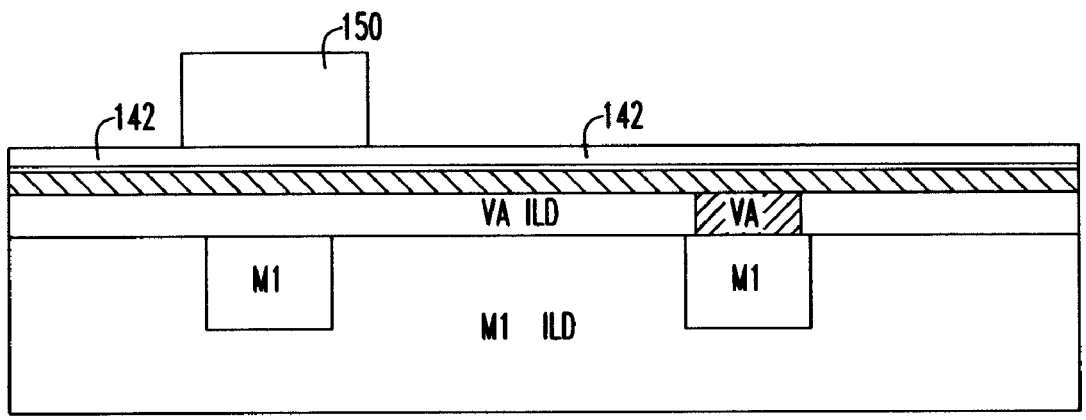
Figure 4:
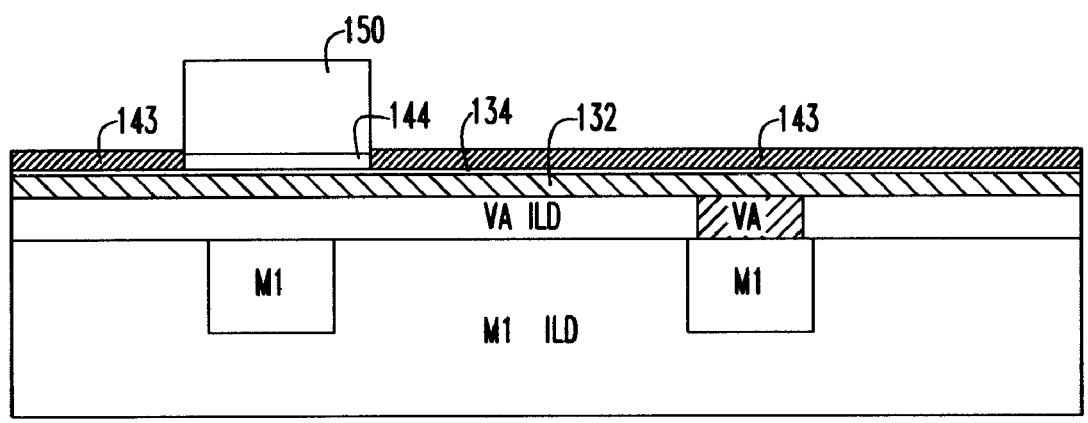

Thereafter, as illustrated in FIG. 3, the hard mask layer 150 is patterned (typically, together with the foregoing described layer of TaN) to selectively expose portions 142 of the free layer. The exposed portions 142 of the free layer are then converted to electrically and magnetically inactive material by chemically and/or physically altering the material composition. A variety of processes can be utilized to effect such alteration. Referring to FIG. 4, such processing results in the formation of portions 143 of inactivated material where the free layer is not protected by the hard mask 150. Such portions 143 are made magnetically inactive, such that no net moment is present. The portions 143 are also made highly resistive, such that their effects as a shunt path around the tunnel barrier 134 can be ignored.

As illustrated in FIG. 4, some volumetric expansion typically occurs when the material of the free layer in portions 143 is inactivated as a result of oxidation or other similar conversion. The oxidation process must be conducted in a manner so that any such volumetric expansion does not cause excessive stress or delamination of one or more layers of the structure. In addition, the processing method used to inactivate the material in portions 143 should prevent the inactivated material from being converted back into a conductive and/or magnetic phase by subsequent processing. Moreover, the condition of the tunnel barrier layer 134, as well as the portion 144 of the free layer protected by the hard mask 150, should not be degraded by such subsequent processing, e.g., subsequent high temperature processing.

As will now be described, several methods are available to effect the conversion of the exposed portions of the free layer, although the invention is not limited to any particular method. A first method for altering the free layer material involves oxidation by exposure to a plasma. In this first method, a plasma which contains oxygen ions is applied to the exposed portions of the free layer. Plasma oxidation can be performed with or without accelerating oxygen ions in a direction normal to the surface of the exposed portions to implant the oxygen ions therein. When such plasma implantation is used, any undercut of the portion of the tunnel barrier layer 134 and of the free layer beneath the hardmask 150 can be made slight, particularly when the process is performed at or below room temperature. The plasma oxidation can be performed whether or not accompanied by directional acceleration for implantation, and whether or not performed at a reduced temperature. For more rapid and more thorough conversion of the magnetic material, plasma oxidation can also be performed at elevated temperatures, as high as the integrity of the tunnel junction will allow (approximately 300–400° C.).

Another conversion technique involves exposure to fluorine and/or nitrogen agents. Other available techniques include ion implantation that is not performed in presence of a plasma. Anodization is another suitable technique wherein wet electrochemistry provides a source of additional atoms to chemically alter the exposed portions 142 of the free layer. Lastly, combinations of any of the above methods can be used with increased effectiveness.

Patterning of the MTJ by conversion of exposed portions 142 of the free layer offers the following advantages. Referring to FIG. 1, edges including first edges 135 and second edges (not shown) of the MTJ structure are prevented from being exposed to ambients during processing. This reduces the risk of corrosion and resulting degradation of the MTJ. A large process window is achieved for sufficiently or completely oxidizing the material of the free layer in portions 143, while stopping on the tunnel barrier 134 to leave the pinned layer 132 substantially unaffected. Oxidation that stops on the tunnel barrier 134 reduces offset fields from demagnetization contributions from the pinned layer 132. For example, a standard etch process will likely penetrate part-way into the pinned layer, leaving an unpredictable magnetic field emanating from the edge of the pinned layer. When the pinned layer of an MTJ makes a demagnetization contribution, a resultant unbalanced magnetic coupling can cause a shift in the hysteresis loop for the MTJ, reducing the operating window. By eliminating the demagnetization contribution and reducing the loop offset, more uniform behavior among MTJ elements can be achieved across a chip and across the entire wafer. While it is in principle possible to use etch techniques to stop on the tunnel barrier 134, in practice, this is quite difficult, and the conversion techniques outlined in this invention provide a much larger process window to allow effective stopping on the tunnel barrier 134.

With continued reference to FIG. 1, after free layer conversion, the converted regions 143, the tunnel barrier layer 134 and the pinned layer 132 are now patterned at edges 156 to electrically isolate MTJs from each other. This is preferably performed in the following manner. With the patterned TiN hardmask material 150 (FIG. 4) still in place, a dielectric layer 152, e.g. of silicon dioxide or silicon nitride, is deposited over the structure in turn, followed by deposition and patterning of a photoresist material. The dielectric layer 152 is then patterned, followed by stripping the photoresist, and the dielectric layer 152 becomes a hardmask for reactive ion etching (RIE) the layers 143, 134, and 132 selectively to the underlying material of VA ILD 124. The dielectric material 152 tends to become eroded near the outer edges 156 of the patterned structure, accounting for their sloped appearance. Thereafter, the M2 ILD 120 is deposited over the patterned structure, and then polished flat and patterned to form a trough-shaped opening that exposes the hard mask material 150 (FIG. 4).

When the hardmask material 150 is a conductive material such as TiN, the hard mask material is left in place as the conductive member 160 shown in FIG. 1. In such case, the M2 conductive line 104 is deposited in the opening in contact with the hardmask material to complete the structure shown in FIG. 1. In such structure, the previously deposited TiN material 150 is now used to conductively interconnect the M2 conductive line 104 to the MTJ 100. When the hardmask material 150 is a sacrificial material such as a dielectric, the sacrificial material is removed from the opening to expose the TaN cover portion of the free layer 136. For example, oxygen ashing would be used to remove a SiLK dielectric mandrel. A conductive member 160 is then formed in place of the prior hardmask, as by the same metallization process used to form the M2 metallization layer including M2 conductive line 104.

Figure 5:
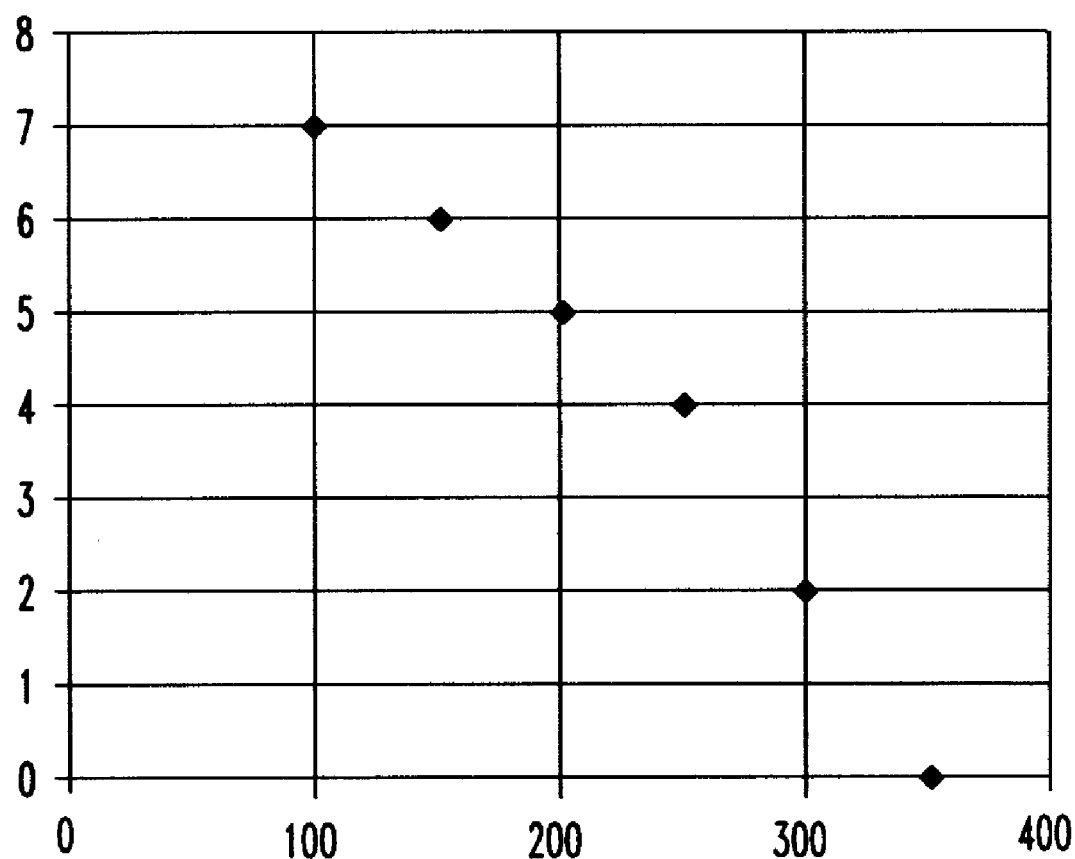
FIG. 5 is a graph illustrating the Kerr signal returned from a ferromagnetic material layer, after processing the layer with oxygen ions at selected acceleration voltages.

FIG. 5 provides data to show conclusively that a NiFe magnetic free layer is converted to an essentially magnetically neutral layer by oxidation when conditions sufficiently oxidize the free layer. The data points graphed in FIG. 5 are expressed in Kerr signal vs. acceleration voltage for oxygen ions. When light is reflected from the surface of a magnetized layer, i.e. one having a substantial proportion of the dipoles contained in the layer oriented in one direction, a change is observed in the polarization of the light. The measured change in polarization is a Kerr signal. The more strongly the layer is magnetized, the stronger the Kerr signal becomes. FIG. 5 illustrates that when the magnetic free layer is more completely oxidized by driving oxygen ions into the free layer at higher acceleration voltage, the Kerr signal drops, and eventually reaches zero. This demonstrates the effectiveness of the technique in making the free layer become magnetically neutral.

A corresponding increase in film sheet resistance has been observed with increasing oxidation of the NiFe layer. Experiments have shown that when the Kerr signal eventually decreases to zero, the resistance of the NiFe layer becomes extremely large, such that the oxidized free layer does not shunt an appreciable amount of current away from the active MTJ. These experiments demonstrate that the material of the free layer such as NiFe can be converted to a magnetically and electrically inactive form by oxidation.

According to a preferred embodiment of the invention, oxidation by ion implantation is performed using Ar and $O_2$ in an atomic ratio of 10 to 1. Post implantation annealing is performed at a temperature ranging between about 150 to 500 degrees C., preferably between about 250 to 350 degrees C., and most preferably between 250 and 300 degrees C. Experiments have shown that such annealing does not magnetically reactivate the oxidized NiFe.

According to preferred embodiments of the invention, the addition of cobalt to the alloy used as the free layer enhances the propensity of such layer to be oxidized. Cobalt-containing materials such as NiCoFe and CoFeB are among such materials available for use as the free layer material. The presence of boron in amorphous alloys such as the CoFeB leads to formation of a glassy oxidized phase having good dielectric properties.

Referring to FIG. 1, one result of the process according an embodiment of the invention is that the edges 135 of the MTJ 100 including first edges 135 and second edges (not shown) are protected from exposure to an ambient during processing. As described in the background, the conventional process leaves the edges of the MTJ exposed to an ambient during processing, which can result in corrosion or degradation during subsequent processing. Other advantages of the MTJ according to embodiments of the invention include protecting the underlying layer (i.e., the pinned layer) from being affected by processes such as oxidation or partial etching. The fabrication of MTJ structures including moisture-sensitive tunnel barriers or which use amorphous alloys as the free layer is aided by the embodiments of the invention because of the reduced exposure to ambients. The MTJ stack may include a tunnel barrier layer having a material that is moisture sensitive, such as MgO. In such case, patterning of the MTJ by oxidation rather than by etching protects the tunnel barrier layer from exposure to ambients. Protecting such tunnel barrier layer can be essential to providing an MTJ having good switching characteristics.

Finally, processes according to foregoing described embodiments of the invention are implemented using readily available and simple techniques. For that reason, they are cost-effective to implement. In addition, processes according to the foregoing described embodiments are easily integrated into fabrication processes for MRAMs that include storage cells having field effect transistors (FETs) to control the MTJs, as well as MRAMs without such transistors (in the so-called crosspoint architecture).

While the invention has been described in accordance with certain preferred embodiments thereof, those skilled in the art will understand the many modifications and enhancements which can be made thereto without departing from the true scope and spirit of the invention, which is limited only by the claims appended below.

The invention claimed is:

1. A method of patterning a magnetic tunnel junction (MTJ) stack comprising;
    forming an MTJ stack having a free layer, a pinned layer and a tunnel barrier layer disposed between said free layer and said pinned layer;
    forming a conductive hard mask overlying a first area of said MTJ stack while exposing said free layer of said MTJ stack in a second area;
    rendering said free layer electrically and magnetically inactive in said second area; and
    forming a conductive line contacting said hard mask, said hard mask conductively interconnecting said MTJ stack to said conductive line.

2. A method as claimed in claim 1, wherein said stack is formed over one or more interlevel dielectric layers in which one or more respective metal conductor layers are disposed.

3. A method as claimed in claim 1, wherein said free layer is rendered electrically and magnetically inactive through conversion to an inert compound by chemically altering its composition.

4. A method as claimed in claim 3, wherein said free layer is chemically altered by plasma treatment.

5. The method of claim 4, wherein said chemical alteration further includes acceleration of oxygen ions.

6. The method of claim 3, wherein said free layer is chemically altered by exposure to a chemical agent including at least one agent selected from the group consisting of fluorine and carbon.

7. The method of claim 3, wherein said free layer is chemically altered by anodization.

8. A method as claimed in claim 1, wherein said free layer is rendered electrically and magnetically inactive through oxidation.

9. The method of claim 1, wherein said free layer is rendered electrically and magnetically inactive by physically altering its composition.

10. The method of claim 9, wherein said free layer is rendered electrically and magnetically inactive by diffusion of at least one agent out of an adjacent "donor" film into said free layer, said at least one agent selected from the group consisting of oxygen, nitrogen, fluorine, and carbon.

11. The method of claim 1, wherein said hard mask includes at least one material selected from the group consisting of titanium nitride (TiN) and tantalum nitride (TaN).

12. The method as claimed in claim 11, wherein said hard mask includes titanium nitride (TiN).

13. The method as claimed in claim 1, wherein a lower surface of said conductive line contacts said hard mask.

14. The method as claimed in claim 1, wherein said free layer includes iron, and said tunnel barrier layer includes magnesium oxide.

15. The method as claimed in claim 1, wherein said step of rendering said free layer electrically and magnetically inactive in said second area forms a moisture barrier for protecting said tunnel barrier layer including magnesium oxide.

16. The method as claimed in claim 1, wherein said free layer includes nickel-cobalt-iron (NiCoFe).

17. The method as claimed in claim 1, wherein said free layer includes cobalt-iron-boron (CoFeB).

18. The method as claimed in claim 17, wherein said step of rendering includes oxidizing said CoFeB of said free layer to form a region having glassy oxidized phase.

* * * * *